US012604667B2

(12) United States Patent
Chatani et al.

(10) Patent No.: US 12,604,667 B2
(45) Date of Patent: Apr. 14, 2026

(54) PIEZOELECTRIC DEVICE

(71) Applicant: Murata Manufacturing Co., Ltd.,
Nagaokakyo (JP)

(72) Inventors: Munehito Chatani, Nagaokakyo (JP);
Shinsuke Ikeuchi, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 813 days.

(21) Appl. No.: 17/992,967

(22) Filed: Nov. 23, 2022

(65) Prior Publication Data

US 2023/0086450 A1      Mar. 23, 2023

Related U.S. Application Data

(63) Continuation of application No.
PCT/JP2021/021025, filed on Jun. 2, 2021.

(30) Foreign Application Priority Data

Jun. 18, 2020      (JP) ................................. 2020-105094

(51) Int. Cl.
*H02N 2/00*          (2006.01)
*H10N 30/853*       (2023.01)
*H10N 30/87*         (2023.01)

(52) U.S. Cl.
CPC ......... *H10N 30/871* (2023.02); *H10N 30/853*
(2023.02)

(58) Field of Classification Search
CPC ........................... H10N 30/871; H10N 30/853
See application file for complete search history.

(56) References Cited

U.S. PATENT DOCUMENTS

2007/0284971 A1* 12/2007 Sano ...................... H04R 19/04
                                                              310/364
2014/0085694 A1* 3/2014 Aga ..................... G02B 26/101
                                                              310/366
2015/0035906 A1* 2/2015 Mizuno ................ B41J 2/14209
                                                              347/50

(Continued)

FOREIGN PATENT DOCUMENTS

JP          2014-82464 A      5/2014
JP          2019-96933 A      6/2019
                (Continued)

OTHER PUBLICATIONS

Official Communication issued in International Patent Application
No. PCT/JP2021/021025, mailed on Aug. 24, 2021.

(Continued)

*Primary Examiner* — Bryan P Gordon
(74) *Attorney, Agent, or Firm* — Keating & Bennett, LLP

(57)                    ABSTRACT

A layered portion includes, at least above an opening, a first
single-crystal piezoelectric body layer, a second single-
crystal piezoelectric body layer, an intermediate electrode
layer, a lower electrode layer, and an upper electrode layer.
The first single-crystal piezoelectric body layer includes a
material that produces a difference in etching rate between
a positive side and a negative side of a polarization charge.
The polarization charge of the first single-crystal piezoelec-
tric body layer is negative on a side of the intermediate
electrode layer and positive on a side of the lower electrode
layer.

20 Claims, 8 Drawing Sheets

(56)        References Cited

U.S. PATENT DOCUMENTS

| | | | | |
|---|---|---|---|---|
| 2018/0069168 A1* | 3/2018 | Ikeuchi | .................. | H10N 30/05 |
| 2019/0288667 A1* | 9/2019 | Hayashi | ............. | H03H 9/02574 |
| 2020/0168787 A1 | 5/2020 | Ikeuchi et al. | | |
| 2021/0143315 A1* | 5/2021 | Kishimoto | ............. | H10N 30/87 |
| 2022/0384708 A1* | 12/2022 | Kishimoto | ........... | H10N 30/072 |
| 2023/0086450 A1* | 3/2023 | Chatani | .................. | H10N 30/85 |
| | | | | 310/328 |

FOREIGN PATENT DOCUMENTS

| | | | |
|---|---|---|---|
| JP | 2020-14096 A | 1/2020 |
| WO | 2016/175013 A1 | 11/2016 |
| WO | 2019/102951 A1 | 5/2019 |

OTHER PUBLICATIONS

Chatani, "Piezoelectric Device", U.S. Appl. No. 17/991,858, filed Nov. 22, 2022.

* cited by examiner

PIEZOELECTRIC DEVICE

CROSS REFERENCE TO RELATED APPLICATIONS

This application claims the benefit of priority to Japanese Patent Application No. 2020-105094 filed on Jun. 18, 2020 and is a Continuation Application of PCT Application No. PCT/JP2021/021025 filed on Jun. 2, 2021. The entire contents of each application are hereby incorporated herein by reference.

BACKGROUND OF THE INVENTION

1. Field of the Invention

The present invention relates to a piezoelectric device.

2. Description of the Related Art

WO2019/102951 discloses a configuration of a piezoelectric device. The piezoelectric device described in WO2019/102951 includes a piezoelectric single crystal body, an upper electrode, a lower electrode, and a supporting substrate. The piezoelectric single crystal body is homogeneous in polarization state. The upper electrode is arranged on an upper surface of the piezoelectric single crystal body. The lower electrode is arranged on a lower surface of the piezoelectric single crystal body. The supporting substrate is arranged below the piezoelectric single crystal body. A recess extending from a lower surface of the supporting substrate toward the lower surface of the piezoelectric single crystal body is provided.

SUMMARY OF THE INVENTION

The piezoelectric device described in WO2019/102951 includes only a single single-crystal piezoelectric body layer. When an attempt to increase an amplitude in excitation of the piezoelectric device is made, an area of the single-crystal piezoelectric body layer when viewed in a direction orthogonal to the single-crystal piezoelectric body layer increases and hence an area occupied by the piezoelectric device increases.

When an attempt to increase an amplitude in excitation of the piezoelectric device is made by providing two single-crystal piezoelectric body layers, a time period required for etching in providing a hole for electrical connection to a lower electrode layer becomes long and efficiency of production of the piezoelectric device is lowered.

Preferred embodiments of the present invention provide piezoelectric devices that each can achieve an increase in amplitude in excitation thereof while an increase in an area occupied by the piezoelectric device and lowering in efficiency of production of the piezoelectric device are reduced or prevented.

A piezoelectric device according to a preferred embodiment of the present invention includes a base portion and a layered portion. The base portion includes a first main surface and a second main surface located opposite to the first main surface, and includes an opening in the first main surface. The layered portion is layered on a side of the first main surface of the base portion to cover the opening from above. The layered portion includes, at least above the opening, a first single-crystal piezoelectric body layer, a second single-crystal piezoelectric body layer above the first single-crystal piezoelectric body layer, an intermediate electrode layer between the first single-crystal piezoelectric body layer and the second single-crystal piezoelectric body layer, a lower electrode layer on a lower side of the first single-crystal piezoelectric body layer and opposed to the intermediate electrode layer with the first single-crystal piezoelectric body layer being interposed, and an upper electrode layer on an upper side of the second single-crystal piezoelectric body layer and opposed to the intermediate electrode layer with the second single-crystal piezoelectric body layer being interposed, and the layered portion includes a membrane portion covering the opening. The layered portion is provided with a hole that reaches the lower electrode layer through the first single-crystal piezoelectric body layer, the intermediate electrode layer, and the second single-crystal piezoelectric body layer at a position on an outer side of the opening when viewed in a direction orthogonal to the first main surface. A drawn electrode connected to the lower electrode layer and insulated from the intermediate electrode layer in the inside of the hole and drawn to an upper surface of the second single-crystal piezoelectric body layer is provided. The first single-crystal piezoelectric body layer includes a material that produces a difference in etching rate between a positive side and a negative side of a polarization charge. The polarization charge of the first single-crystal piezoelectric body layer is negative on a side of the intermediate electrode layer and positive on a side of the lower electrode layer.

According to preferred embodiments of the present invention, an amplitude in excitation of a piezoelectric device can be increased while an increase in an area occupied by the piezoelectric device and lowering in efficiency of production of the piezoelectric device are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
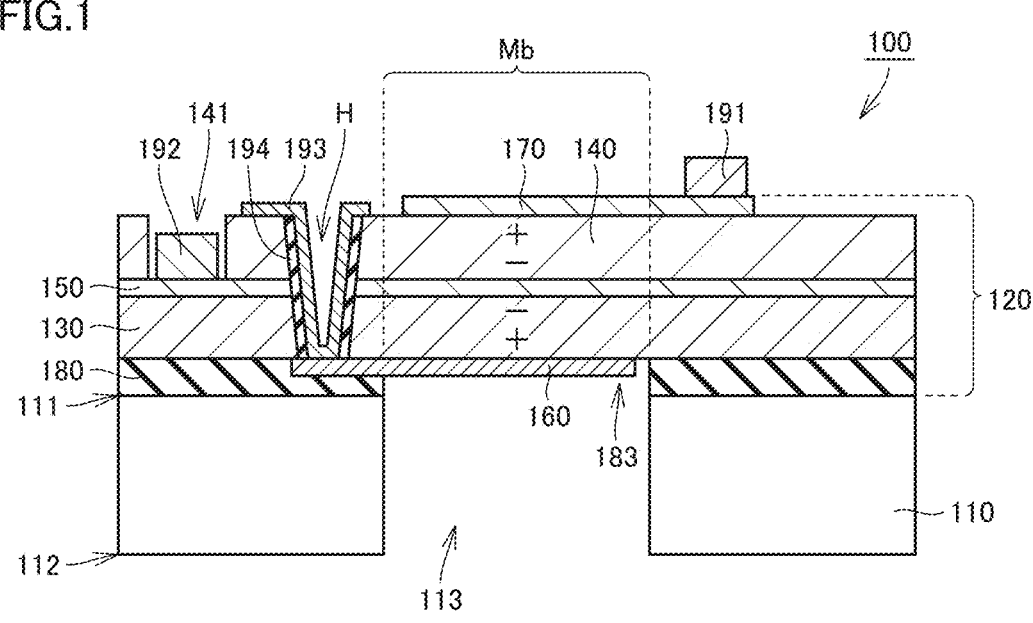
FIG. 1 is a vertical cross-sectional view of a piezoelectric device according to a first preferred embodiment of the present invention.

FIG. 1 is a vertical cross-sectional view of a piezoelectric device according to a first preferred embodiment of the present invention. As shown in FIG. 1, a piezoelectric device 100 according to the first preferred embodiment of the present invention includes a base portion 110 and a layered portion 120.

Base portion 110 includes one main surface 111 and the other main surface 112 located opposite to one main surface 111. Base portion 110 includes an opening 113 provided in one main surface 111. In the present preferred embodiment, opening 113 extends from one main surface 111 to the other main surface 112. Opening 113 may extend from a side of one main surface 111 but does not have to reach the other main surface 112. Alternatively, opening 113 may extend from a side of the other main surface 112 to a position close to one main surface 111 but does not have to reach one main surface 111. Opening 113 is covered from above with layered portion 120 layered on the side of one main surface 111 of base portion 110.

In the present preferred embodiment, base portion 110 is composed of Si. A material for forming base portion 110 is not limited to Si.

Layered portion 120 includes, at least above opening 113, a first single-crystal piezoelectric body layer 130, a second single-crystal piezoelectric body layer 140, an intermediate electrode layer 150, a lower electrode layer 160, and an upper electrode layer 170.

Layered portion 120 includes a membrane portion Mb which is a portion that covers opening 113. Membrane portion Mb is a portion in layered portion 120 located on an inner side of an opening end of opening 113 when viewed in a direction orthogonal to one main surface 111.

Layered portion 120 is provided with a hole H that reaches lower electrode layer 160 through first single-crystal piezoelectric body layer 130, intermediate electrode layer 150, and second single-crystal piezoelectric body layer 140 at a position on an outer side of opening 113 when viewed in the direction orthogonal to one main surface 111. An insulating film 194 is formed on an inner circumferential surface of hole H. A drawn electrode 193 connected to lower electrode layer 160 while being insulated from intermediate electrode layer 150 in the inside of hole H and drawn to an upper surface of second single-crystal piezoelectric body layer 140 is provided.

First single-crystal piezoelectric body layer 130 is located above base portion 110. A portion of first single-crystal piezoelectric body layer 130 is located above opening 113. Each of an upper surface and a lower surface of first single-crystal piezoelectric body layer 130 is flat.

Second single-crystal piezoelectric body layer 140 is located above first single-crystal piezoelectric body layer 130. A portion of second single-crystal piezoelectric body layer 140 is located above opening 113. Each of an upper surface and a lower surface of second single-crystal piezoelectric body layer 140 is flat.

Second single-crystal piezoelectric body layer 140 includes a hole 141. Hole 141 vertically passes through second single-crystal piezoelectric body layer 140. In the present preferred embodiment, hole 141 is located above one main surface 111 of base portion 110 and is not located above opening 113.

First single-crystal piezoelectric body layer 130 is composed of a material that produces a difference in etching rate between a positive side and a negative side of a polarization charge. Second single-crystal piezoelectric body layer 140 is composed of a material that produces a difference in etching rate between the positive side and the negative side of the polarization charge. Second single-crystal piezoelectric body layer 140 may be composed of a material the same as or different from the material for first single-crystal piezoelectric body layer 130.

In the present preferred embodiment, each of first single-crystal piezoelectric body layer 130 and second single-crystal piezoelectric body layer 140 is composed of lithium niobate ($LiNbO_3$) or lithium tantalate ($LiTaO_3$). Each of first single-crystal piezoelectric body layer 130 and second single-crystal piezoelectric body layer 140 may be composed of a niobate compound or a tantalate compound of an alkali metal other than K and Na.

The polarization charge of first single-crystal piezoelectric body layer 130 is negative on a side of intermediate electrode layer 150 and positive on a side of lower electrode layer 160. The polarization charge of second single-crystal piezoelectric body layer 140 is negative on the side of intermediate electrode layer 150 and positive on a side of upper electrode layer 170. The polarization charge of second single-crystal piezoelectric body layer 140 may be positive on the side of intermediate electrode layer 150 and negative on the side of upper electrode layer 170.

Intermediate electrode layer 150 is located between first single-crystal piezoelectric body layer 130 and second single-crystal piezoelectric body layer 140. Intermediate electrode layer 150 lies between the upper surface of first single-crystal piezoelectric body layer 130 and the lower surface of second single-crystal piezoelectric body layer 140. A portion of intermediate electrode layer 150 is located above opening 113. Each of an upper surface and a lower surface of intermediate electrode layer 150 is flat. Intermediate electrode layer 150 may be formed by layering of two electrode layers. In the present preferred embodiment, intermediate electrode layer 150 is smaller in thickness than each of lower electrode layer 160 and upper electrode layer 170. Intermediate electrode layer 150 may be equal to or larger than each of lower electrode layer 160 and upper electrode layer 170 in thickness.

Intermediate electrode layer 150 is composed of a metal such as Al or Pt. Intermediate electrode layer 150 may be composed of Si doped with As or the like and being low in electrical resistivity. In this case, intermediate electrode layer 150 is preferably composed, for example, of Si having electrical resistivity equal to or lower than about 20 mΩ cm. Alternatively, intermediate electrode layer 150 may be composed of a conductive oxide such as $LaNiO_3$, $SrRuO_3$, or $RuO_2$.

Figures 15, 16, 17:
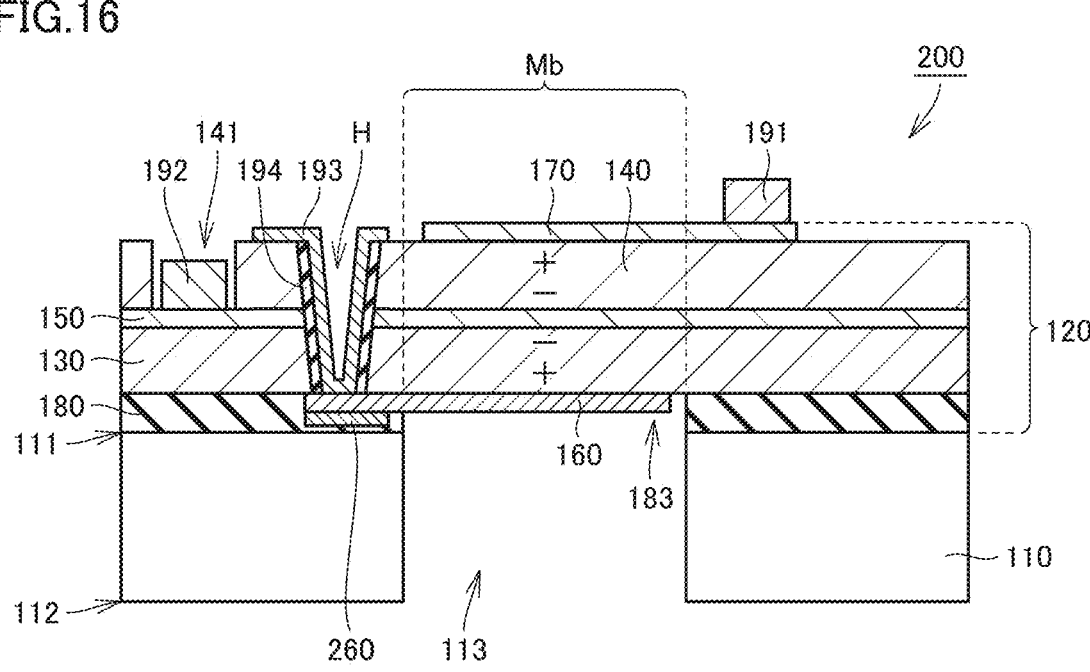
FIG. 15 is a cross-sectional view showing a state in which each of a first drawn interconnection and a second drawn interconnection is formed in the method of manufacturing a piezoelectric device according to the first preferred embodiment of the present invention.
FIG. 16 is a vertical cross-sectional view of a piezoelectric device according to a second preferred embodiment of the present invention.
FIG. 17 is a partial view showing a Ti layer provided between the intermediate electrode layer and the first single-crystal piezoelectric body layer.

As shown in FIG. 17, an adhesive layer composed of Ti or the like may be arranged between intermediate electrode layer 150 and first single-crystal piezoelectric body layer 130. An adhesive layer composed of Ti or the like may be arranged between intermediate electrode layer 150 and second single-crystal piezoelectric body layer 140.

Lower electrode layer 160 is arranged on a lower side of first single-crystal piezoelectric body layer 130 and is opposed to intermediate electrode layer 150 with first single-crystal piezoelectric body layer 130 being interposed. A portion of lower electrode layer 160 is located above opening 113. Another portion of lower electrode layer 160 is located below hole H provided in first single-crystal piezoelectric body layer 130. Another portion of lower electrode layer 160 covers hole H from below.

Lower electrode layer 160 is composed of a metal such as Al or Pt. Lower electrode layer 160 may be composed of a conductive oxide such as $LaNiO_3$, $SrRuO_3$, or $RuO_2$. Lower electrode layer 160 may be formed from an epitaxially grown film formed by epitaxial growth of a conductive substance.

Upper electrode layer 170 is arranged on an upper side of second single-crystal piezoelectric body layer 140 and is opposed to intermediate electrode layer 150 with second single-crystal piezoelectric body layer 140 being interposed. A portion of upper electrode layer 170 is located above opening 113.

Upper electrode layer 170 is composed of a metal such as Al or Pt. Upper electrode layer 170 may be formed from an epitaxially grown film formed by epitaxial growth of a conductive substance. An adhesive layer composed of Ti or the like may be arranged between upper electrode layer 170 and second single-crystal piezoelectric body layer 140.

Drawn electrode 193 is formed to extend over the upper surface of second single-crystal piezoelectric body layer 140, over an inner circumferential surface of insulating film 194, and over an upper surface of a portion of lower electrode layer 160 exposed through hole H. Drawn electrode 193 is composed of a metal such as Al or Pt. Insulating film 194 is composed of an insulating substance such as $SiO_2$.

Layered portion 120 further includes an intermediate layer 180. Lower electrode layer 160 is interposed between intermediate layer 180 and first single-crystal piezoelectric body layer 130. In a lower surface of intermediate layer 180, an opening 183 that communicates with opening 113 in base portion 110 is provided. Opening 183 is located above opening 113. A portion of the lower surface of lower electrode layer 160 is exposed through opening 183. A portion of the lower surface of lower electrode layer 160 exposed through opening 183 defines a lower surface of membrane portion Mb.

Intermediate layer 180 is composed of $SiO_2$. A material for intermediate layer 180 is not limited to $SiO_2$ but should only be an insulating substance. For example, intermediate layer 180 may be composed of an electrically insulating and thermally insulating organic material.

Piezoelectric device 100 further includes a first drawn interconnection 191 and a second drawn interconnection 192. First drawn interconnection 191 is arranged on the upper side of upper electrode layer 170. Second drawn interconnection 192 is arranged on the upper side of intermediate electrode layer 150 within hole 141.

Layered portion 120 thus includes first single-crystal piezoelectric body layer 130, second single-crystal piezoelectric body layer 140, intermediate electrode layer 150, lower electrode layer 160, and upper electrode layer 170 at least above opening 113.

In the present preferred embodiment, opening 113 has a rectangular outer geometry when viewed in the direction orthogonal to one main surface 111. The outer geometry of opening 113 is not limited to the rectangular shape when viewed in the direction orthogonal to one main surface 111, but may be a polygonal shape other than the rectangular shape or a circular shape.

According to the construction above, as a voltage is applied across lower electrode layer 160 and intermediate electrode layer 150, first single-crystal piezoelectric body layer 130 extends or contracts, and as a voltage is applied across upper electrode layer 170 and intermediate electrode layer 150, second single-crystal piezoelectric body layer 140 extends or contracts. On the other hand, since each of upper electrode layer 170, intermediate electrode layer 150, and lower electrode layer 160 does not extend or contract, membrane portion Mb vertically vibrates while being bent.

A non-limiting example of a method of manufacturing a piezoelectric device according to the first preferred embodiment of the present invention will be described below.

Figure 2:
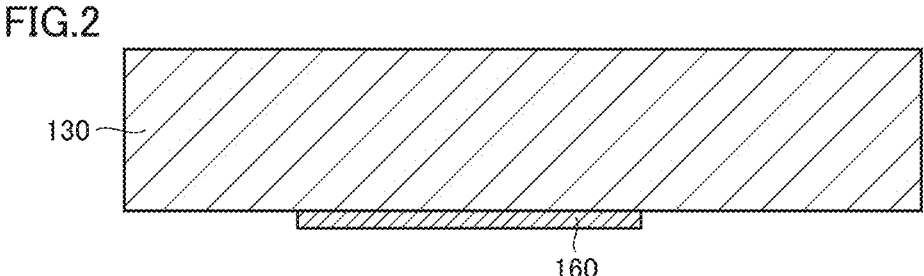
FIG. 2 is a cross-sectional view showing a state in which a lower electrode layer is provided on a lower surface of a first single-crystal piezoelectric body layer in a method of manufacturing a piezoelectric device according to the first preferred embodiment of the present invention.

FIG. 2 is a cross-sectional view showing a state in which the lower electrode layer is provided on the lower surface of the first single-crystal piezoelectric body layer in a method of manufacturing a piezoelectric device according to the first preferred embodiment of the present invention. A thickness of first single-crystal piezoelectric body layer 130 at the time of formation is larger than the thickness of first single-crystal piezoelectric body layer 130 finally included in piezoelectric device 100 according to the present preferred embodiment.

The polarization charge of first single-crystal piezoelectric body layer 130 is negative on the side of the upper surface and positive on the side of the lower surface. First single-crystal piezoelectric body layer 130 is composed of a material that produces a difference in etching rate between the positive side and the negative side of the polarization charge.

As shown in FIG. 2, lower electrode layer 160 is provided on the lower surface of first single-crystal piezoelectric body layer 130 by lift-off, plating, or etching. When lower electrode layer 160 is composed of a conductive oxide, lower electrode layer 160 is provided by formation of a film of a conductive oxide resulting from oxidation of a metal contained in a target on the lower surface of first single-crystal piezoelectric body layer 130 by reactive sputtering. When lower electrode layer 160 is formed from an epitaxially grown film, lower electrode layer 160 is provided by formation of a conductive film on the lower surface of first single-crystal piezoelectric body layer 130 by heteroepitaxial growth and patterning of the conductive film.

Figure 3:
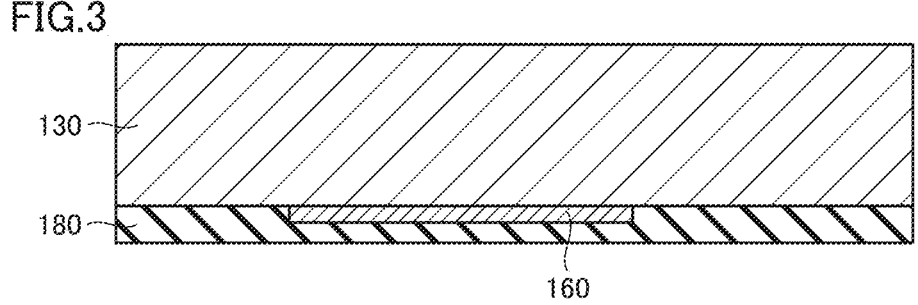
FIG. 3 is a cross-sectional view showing a state in which an intermediate layer is provided on a lower surface of each of the lower electrode layer and the first single-crystal piezoelectric body layer in the method of manufacturing a piezoelectric device according to the first preferred embodiment of the present invention.

FIG. 3 is a cross-sectional view showing a state in which the intermediate layer is provided on the lower surface of each of the lower electrode layer and the first single-crystal piezoelectric body layer in the method of manufacturing a piezoelectric device according to the first preferred embodiment of the present invention. As shown in FIG. 3, intermediate layer 180 is provided on the lower surface of each of lower electrode layer 160 and first single-crystal piezoelectric body layer 130 by chemical vapor deposition (CVD) or physical vapor deposition (PVD), and thereafter the lower surface of intermediate layer 180 is planarized by chemical mechanical polishing (CMP) or the like.

Figure 4:
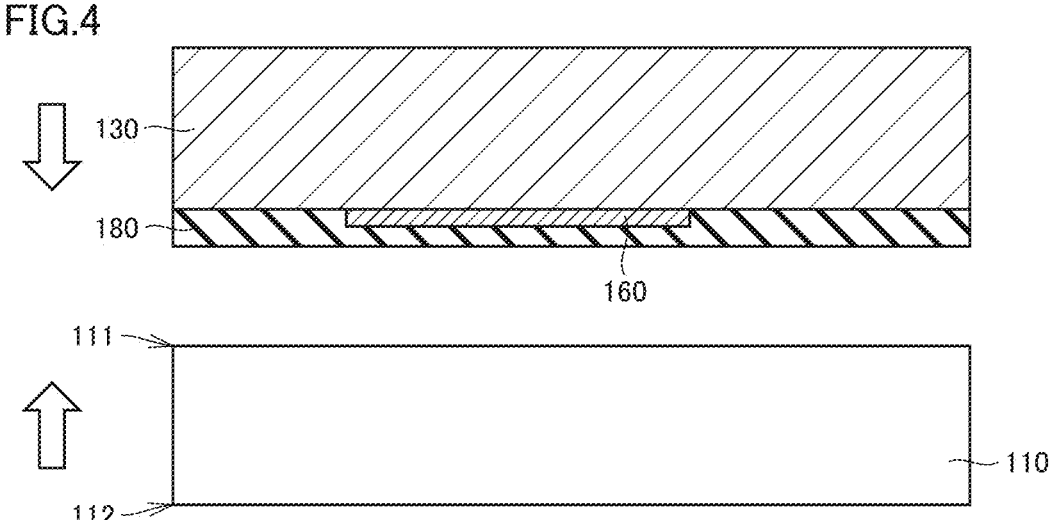
FIG. 4 is a cross-sectional view showing a state in which a base portion is bonded to a plurality of layers shown in FIG. 3, in the method of manufacturing a piezoelectric device according to the first preferred embodiment of the present invention.
Figure 5:
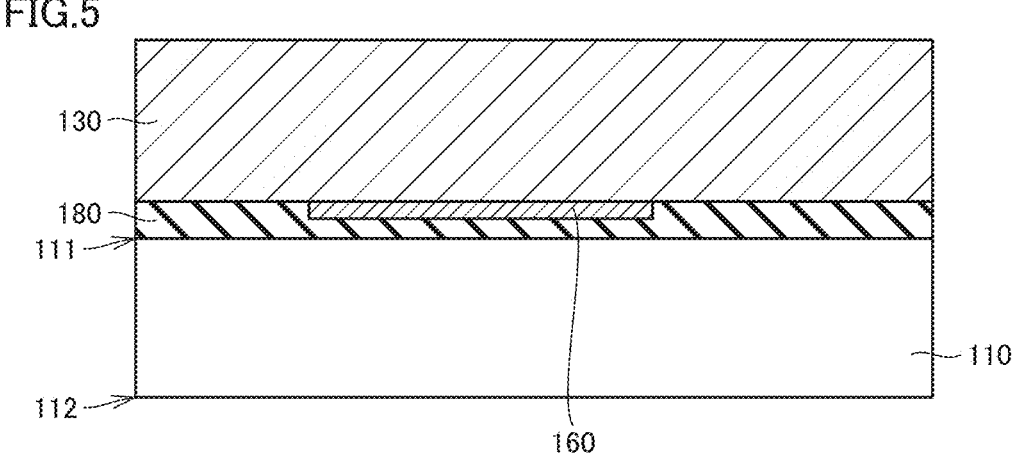
FIG. 5 is a cross-sectional view showing a state in which the base portion has been bonded to a lower surface of the intermediate layer in the method of manufacturing a piezoelectric device according to the first preferred embodiment of the present invention.

FIG. 4 is a cross-sectional view showing a state in which the base portion is bonded to the plurality of layers shown in FIG. 3, in the method of manufacturing a piezoelectric device according to the first preferred embodiment of the present invention. FIG. 5 is a cross-sectional view showing a state in which the base portion has been bonded to the lower surface of the intermediate layer in the method of manufacturing a piezoelectric device according to the first preferred embodiment of the present invention.

As shown in FIGS. 4 and 5, a substrate serving as base portion 110 where no opening 113 is provided is bonded to the lower surface of intermediate layer 180 by surface activated bonding or atomic diffusion bonding. Opening 113 may be provided in advance in base portion 110.

Figure 6:
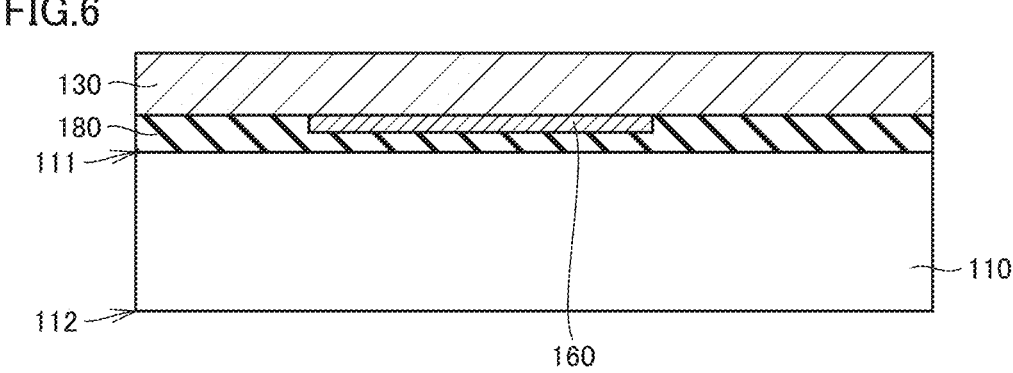
FIG. 6 is a cross-sectional view showing a state in which an upper surface of the first single-crystal piezoelectric body layer is ground in the method of manufacturing a piezoelectric device according to the first preferred embodiment of the present invention.

FIG. 6 is a cross-sectional view showing a state in which the upper surface of the first single-crystal piezoelectric body layer is ground in the method of manufacturing a piezoelectric device according to the first preferred embodiment of the present invention. As shown in FIG. 6, the upper surface of first single-crystal piezoelectric body layer 130 is ground by CMP or the like to a desired thickness. A release layer may be formed on the side of the upper surface of first single-crystal piezoelectric body layer 130 by implantation of ions in advance. In this case, by peeling the release layer before grinding the upper surface of first single-crystal piezoelectric body layer 130 by cutting, CMP, or the like, adjustment of the thickness of first single-crystal piezoelectric body layer 130 is facilitated. The thickness of first single-crystal piezoelectric body layer 130 is adjusted to achieve desired excitation of first single-crystal piezoelectric body layer 130 by application of a voltage.

Figures 7, 8:
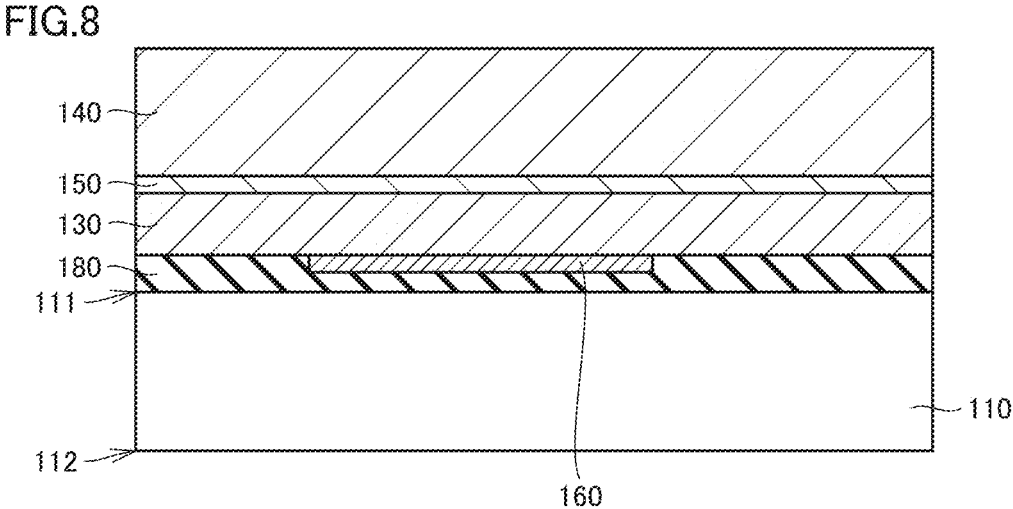
FIG. 7 is a cross-sectional view showing a state in which an intermediate electrode layer is provided on the upper surface of the first single-crystal piezoelectric body layer in the method of manufacturing a piezoelectric device according to the first preferred embodiment of the present invention.
FIG. 8 is a cross-sectional view showing a state in which a second single-crystal piezoelectric body layer is bonded to a plurality of layers shown in FIG. 7 in the method of manufacturing a piezoelectric device according to the first preferred embodiment of the present invention.

FIG. 7 is a cross-sectional view showing a state in which the intermediate electrode layer is provided on the upper surface of the first single-crystal piezoelectric body layer in the method of manufacturing a piezoelectric device according to the first preferred embodiment of the present invention. As shown in FIG. 7, intermediate electrode layer 150 is provided on the upper surface of first single-crystal piezoelectric body layer 130 by lift-off, plating, or etching.

When intermediate electrode layer 150 is composed of Si low in electrical resistivity, an Si substrate doped with As or the like is bonded to the upper surface of first single-crystal piezoelectric body layer 130 by surface activated bonding or atomic diffusion bonding, and thereafter an upper surface of the Si substrate is ground by CMP or the like to a desired thickness. A release layer may be formed on the side of the upper surface of the Si substrate by implantation of ions in advance. In this case, by peeling the release layer before grinding the upper surface of the Si substrate by cutting, CMP, or the like, adjustment of the thickness of the Si substrate is facilitated. When intermediate electrode layer 150 is composed of a conductive oxide, intermediate electrode layer 150 is provided by formation of a film of a conductive oxide resulting from oxidation of a metal contained in a target on the upper surface of first single-crystal piezoelectric body layer 130 by reactive sputtering.

FIG. 8 is a cross-sectional view showing a state in which the second single-crystal piezoelectric body layer is bonded to the plurality of layers shown in FIG. 7 in the method of manufacturing a piezoelectric device according to the first preferred embodiment of the present invention. As shown in FIG. 8, second single-crystal piezoelectric body layer 140 is bonded to the upper surface of intermediate electrode layer 150 by surface activated bonding or atomic diffusion bonding. The thickness of second single-crystal piezoelectric body layer 140 at the time of formation is larger than the thickness of second single-crystal piezoelectric body layer 140 finally included in piezoelectric device 100 according to the present preferred embodiment.

In the present preferred embodiment, the polarization charge of second single-crystal piezoelectric body layer 140 is positive on the side of the upper surface and negative on the side of the lower surface. Second single-crystal piezoelectric body layer 140 is composed of a material that produces a difference in etching rate between the positive side and the negative side of the polarization charge.

Figure 9:
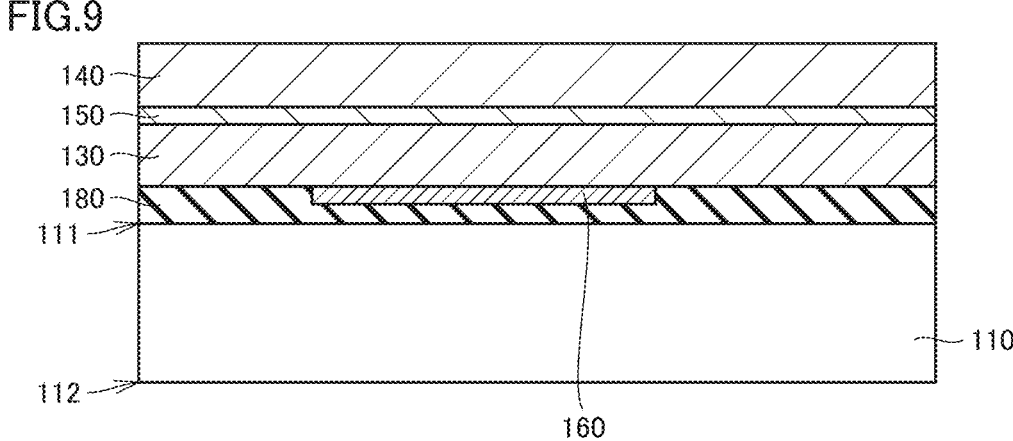
FIG. 9 is a cross-sectional view showing a state in which an upper surface of the second single-crystal piezoelectric body layer is ground in the method of manufacturing a piezoelectric device according to the first preferred embodiment of the present invention.

FIG. 9 is a cross-sectional view showing a state in which the upper surface of the second single-crystal piezoelectric body layer is ground in the method of manufacturing a piezoelectric device according to the first preferred embodiment of the present invention. As shown in FIG. 9, the upper surface of second single-crystal piezoelectric body layer 140 is ground by CMP or the like to a desired thickness. A release layer may be formed on the side of the upper surface of second single-crystal piezoelectric body layer 140 by implantation of ions in advance. In this case, by peeling the release layer before grinding the upper surface of second single-crystal piezoelectric body layer 140 by cutting, CMP, or the like, adjustment of the thickness of second single-crystal piezoelectric body layer 140 is facilitated. The thickness of second single-crystal piezoelectric body layer 140 is adjusted to achieve desired excitation of second single-crystal piezoelectric body layer 140 by application of a voltage.

Figure 10:
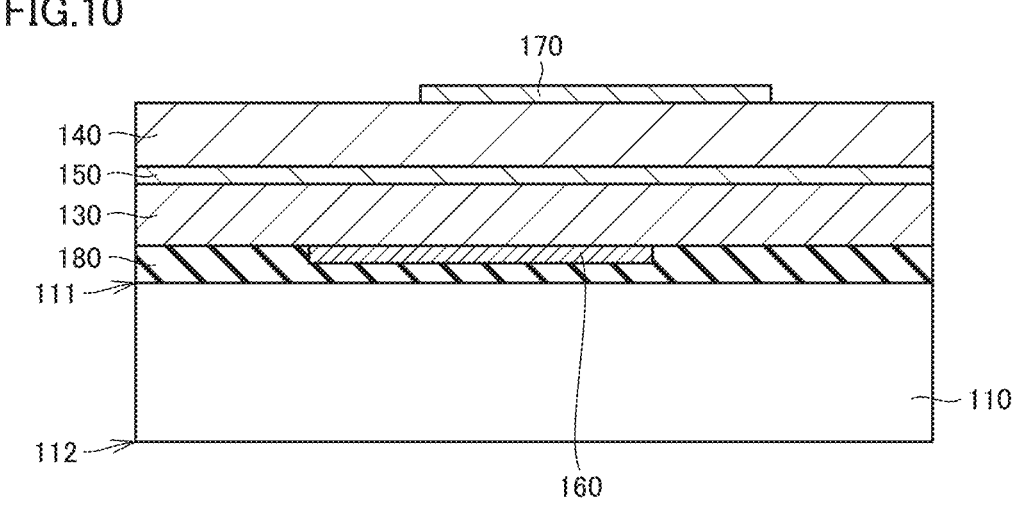
FIG. 10 is a cross-sectional view showing a state in which an upper electrode layer is provided on the upper surface of the second single-crystal piezoelectric body layer in the method of manufacturing a piezoelectric device according to the first preferred embodiment of the present invention.

FIG. 10 is a cross-sectional view showing a state in which the upper electrode layer is provided on the upper surface of the second single-crystal piezoelectric body layer in the method of manufacturing a piezoelectric device according to the first preferred embodiment of the present invention. As shown in FIG. 10, upper electrode layer 170 is provided on the upper surface of second single-crystal piezoelectric body layer 140 by lift-off, plating, or etching. When upper electrode layer 170 is formed from an epitaxially grown film, upper electrode layer 170 is provided by formation of a conductive film on the upper surface of second single-crystal piezoelectric body layer 140 by heteroepitaxial growth and patterning of the conductive film.

Figure 11:
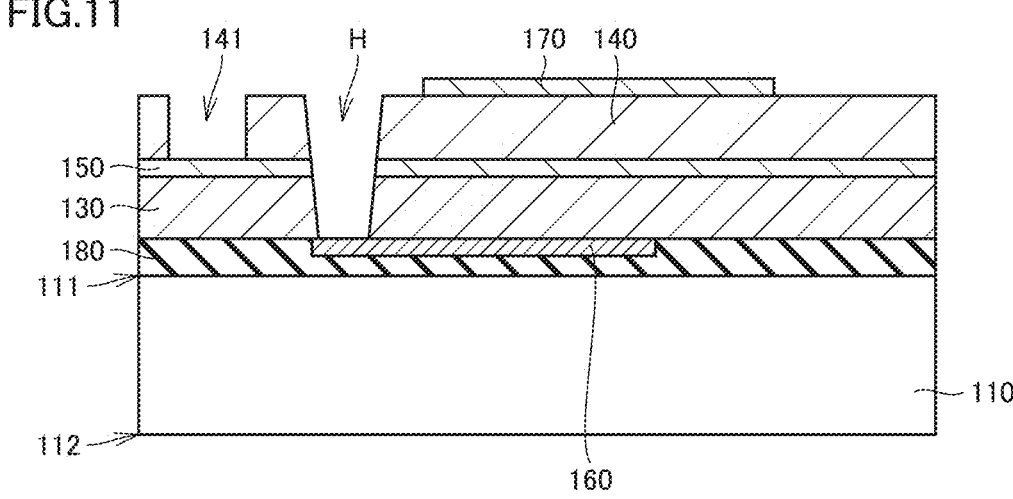
FIG. 11 is a cross-sectional view showing a state in which a hole is provided in a layered portion in the method of manufacturing a piezoelectric device according to the first preferred embodiment of the present invention.

FIG. 11 is a cross-sectional view showing a state in which a hole is provided in the layered portion in the method of manufacturing a piezoelectric device according to the first preferred embodiment of the present invention. As shown in FIG. 11, hole H that reaches lower electrode layer 160 through first single-crystal piezoelectric body layer 130, intermediate electrode layer 150, and second single-crystal piezoelectric body layer 140 is provided by etching. Hole 141 that reaches intermediate electrode layer 150 through second single-crystal piezoelectric body layer 140 is provided by etching.

Each of hole H and hole 141 is provided by etching from the side of the upper surface of second single-crystal piezoelectric body layer 140. Second single-crystal piezoelectric body layer 140 is composed of a material that produces a difference in etching rate between the positive side and the negative side of the polarization charge, and the etching rate in etching from the positive side of the polarization charge is lower than the etching rate in etching from the negative side of the polarization charge. Since the polarization charge of second single-crystal piezoelectric body layer 140 is positive on the side of the upper surface and negative on the side of the lower surface, second single-crystal piezoelectric body layer 140 can be etched at the low etching rate by etching from the side of the upper surface of second single-crystal piezoelectric body layer 140. Penetration by hole 141 through intermediate electrode layer 150 due to overetching can thus be reduced or prevented.

In the present preferred embodiment, since intermediate electrode layer 150 is smaller in thickness than each of lower electrode layer 160 and upper electrode layer 170, a time period required for etching of intermediate electrode layer 150 in providing hole H can be reduced.

After hole H passes through intermediate electrode layer 150, first single-crystal piezoelectric body layer 130 is etched from the side of the upper surface. First single-crystal piezoelectric body layer 130 is composed of a material that produces a difference in etching rate between the positive side and the negative side of the polarization charge, and the etching rate in etching from the negative side of the polarization charge is higher than the etching rate in etching from the positive side of the polarization charge. Since the polarization charge of first single-crystal piezoelectric body layer 130 is negative on the side of the upper surface and positive on the side of the lower surface, first single-crystal piezoelectric body layer 130 can be etched at the high etching rate by etching from the side of the upper surface of first single-crystal piezoelectric body layer 130. A time period required for etching of first single-crystal piezoelectric body layer 130 in providing hole H can thus be reduced.

Figure 12:
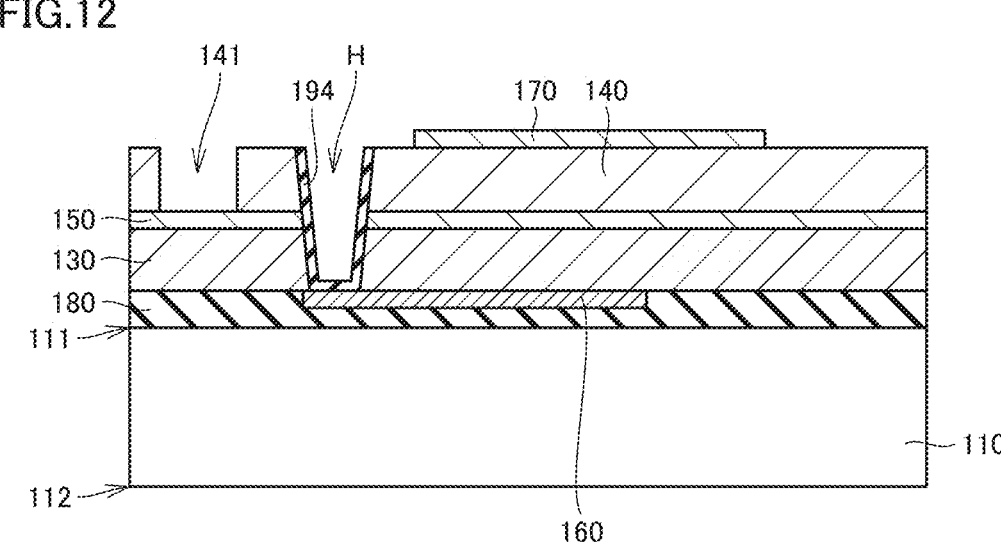
FIG. 12 is a cross-sectional view showing a state in which an insulating film is formed in the inside of the hole provided in the layered portion in the method of manufacturing a piezoelectric device according to the first preferred embodiment of the present invention.

FIG. 12 is a cross-sectional view showing a state in which the insulating film is formed in the inside of the hole provided in the layered portion in the method of manufacturing a piezoelectric device according to the first preferred embodiment of the present invention. As shown in FIG. 12, insulating film 194 is formed in the inside of hole H by sputtering or CVD.

Figure 13:
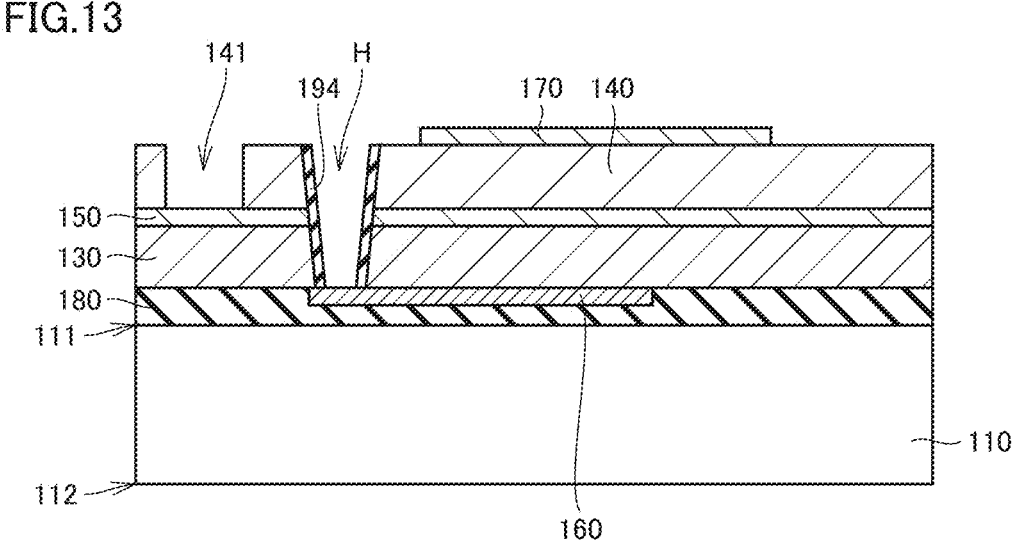
FIG. 13 is a cross-sectional view showing a state in which a central portion of a bottom portion of the insulating film is removed in the method of manufacturing a piezoelectric device according to the first preferred embodiment of the present invention.

FIG. 13 is a cross-sectional view showing a state in which the central portion of the bottom portion of the insulating film is removed in the method of manufacturing a piezoelectric device according to the first preferred embodiment of the present invention. As shown in FIG. 13, a portion of lower electrode layer 160 is exposed by removal of the central portion of the bottom portion of insulating film 194 by etching while a portion of insulating film 194 located on the inner circumferential surface of hole H is left.

Figure 14:
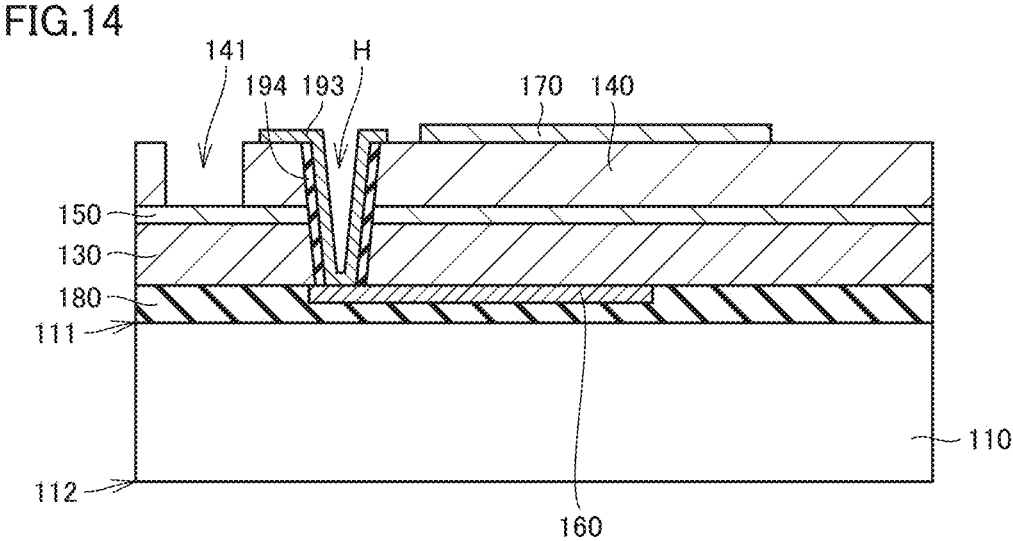
FIG. 14 is a cross-sectional view showing a state in which a drawn electrode is formed in the method of manufacturing a piezoelectric device according to the first preferred embodiment of the present invention.

FIG. 14 is a cross-sectional view showing a state in which the drawn electrode is formed in the method of manufacturing a piezoelectric device according to the first preferred embodiment of the present invention. As shown in FIG. 14, the drawn electrode is formed by sputtering, vapor deposition, or plating to extend over the upper surface of second single-crystal piezoelectric body layer 140, over the inner circumferential surface of insulating film 194, and over the upper surface of a portion of lower electrode layer 160 exposed through hole H.

FIG. 15 is a cross-sectional view showing a state in which each of the first drawn interconnection and the second drawn interconnection is formed in the method of manufacturing a piezoelectric device according to the first preferred embodiment of the present invention. As shown in FIG. 15, first drawn interconnection 191 is formed on the upper surface of upper electrode layer 170 and second drawn interconnection 192 is formed on the upper surface of a portion of intermediate electrode layer 150 exposed through hole 141, by lift-off, plating, or vapor deposition.

Finally, opening 113 is provided in base portion 110 and opening 183 is provided in intermediate layer 180 by etching. Opening 183 does not necessarily have to be provided. Through the process above, piezoelectric device 100 according to the first preferred embodiment of the present invention as shown in FIG. 1 is manufactured.

In piezoelectric device 100 according to the first preferred embodiment of the present invention, membrane portion Mb including two single-crystal piezoelectric body layers which are first single-crystal piezoelectric body layer 130 lying between intermediate electrode layer 150 and lower electrode layer 160 and second single-crystal piezoelectric body layer 140 lying between intermediate electrode layer 150 and upper electrode layer 170 is provided. Therefore, as compared with a piezoelectric device including only a single single-crystal piezoelectric body layer, an amplitude in excitation of the piezoelectric device can be increased without an increase in an area of the single-crystal piezoelectric body layer. Consequently, the amplitude in excitation of piezoelectric device 100 can be increased while an increase in an area occupied by piezoelectric device 100 is reduced or prevented.

In piezoelectric device 100 according to the first preferred embodiment of the present invention, first single-crystal piezoelectric body layer 130 is composed of a material that produces a difference in etching rate between the positive side and the negative side of the polarization charge and the polarization charge of first single-crystal piezoelectric body layer 130 is negative on the side of intermediate electrode layer 150 and positive on the side of lower electrode layer 160. Therefore, first single-crystal piezoelectric body layer 130 can be etched at the high etching rate in providing hole H for electrical connection to lower electrode layer 160 by etching. Accordingly, a time period required for etching of first single-crystal piezoelectric body layer 130 can be reduced. Consequently, lowering in efficiency of production of piezoelectric device 100 caused by including two single-crystal piezoelectric body layers can be reduced or prevented.

In piezoelectric device 100 according to the first preferred embodiment of the present invention, intermediate electrode layer 150 is smaller in thickness than each of lower electrode layer 160 and upper electrode layer 170. Since a time period required for etching of intermediate electrode layer 150 in providing hole H can thus be reduced, lowering in efficiency of production of piezoelectric device 100 can be reduced or prevented.

In piezoelectric device 100 according to the first preferred embodiment of the present invention, intermediate electrode layer 150 may be composed of Si. In this case, since Si is crystallographically stable, it does not react with each of first single-crystal piezoelectric body layer 130 and second single-crystal piezoelectric body layer 140. Therefore, deterioration of characteristics of each of first single-crystal piezoelectric body layer 130 and second single-crystal piezoelectric body layer 140 due to mutual reaction with each of first single-crystal piezoelectric body layer 130 and second single-crystal piezoelectric body layer 140 can be reduced or prevented.

In piezoelectric device 100 according to the first preferred embodiment of the present invention, second single-crystal piezoelectric body layer 140 is composed of a material that produces a difference in etching rate between the positive side and the negative side of the polarization charge and the polarization charge of second single-crystal piezoelectric body layer 140 is negative on the side of intermediate electrode layer 150 and positive on the side of upper electrode layer 170. Therefore, by etching from the side of the upper surface of second single-crystal piezoelectric body layer 140, second single-crystal piezoelectric body layer 140 can be etched at the low etching rate. Consequently, penetration by hole 141 through intermediate electrode layer 150 due to overetching can be reduced or prevented. Consequently, lowering in excitation characteristics of piezoelectric device 100 due to insufficient electrical connection between intermediate electrode layer 150 and second drawn interconnection 192 can be reduced or prevented.

In piezoelectric device 100 according to the first preferred embodiment of the present invention, each of first single-crystal piezoelectric body layer 130 and second single-crystal piezoelectric body layer 140 is composed of a niobate compound or a tantalate compound of an alkali metal other than K and Na, and does not contain lead. Therefore, an environmental load can be reduced. Each of first single-crystal piezoelectric body layer 130 and second single-crystal piezoelectric body layer 140 is composed of lithium niobate ($LiNbO_3$) or lithium tantalate ($LiTaO_3$), so that piezoelectric characteristics of piezoelectric device 100 can be improved.

In piezoelectric device 100 according to the first preferred embodiment of the present invention, at least one of lower electrode layer 160 and intermediate electrode layer 150 may be composed of a conductive oxide. When lower electrode layer 160 is composed of a conductive oxide, in providing hole H by dry etching of first single-crystal piezoelectric body layer 130, a selective etching ratio between first single-crystal piezoelectric body layer 130 and lower electrode layer 160 can be made higher so that a through hole in lower electrode layer 160 caused by overetching can be prevented. When intermediate electrode layer 150 is composed of a conductive oxide, in providing hole 141 by dry etching of second single-crystal piezoelectric body layer 140, a selective etching ratio between second single-crystal piezoelectric body layer 140 and intermediate electrode layer 150 can be made higher so that a through hole in intermediate electrode layer 150 caused by overetching can be prevented.

In piezoelectric device 100 according to the first preferred embodiment of the present invention, at least one of lower electrode layer 160 and upper electrode layer 170 may be formed from an epitaxially grown film. Since the epitaxially grown film is excellent in crystallinity, the occurrence of migration can be reduced or prevented and power durability characteristics of each of lower electrode layer 160 and upper electrode layer 170 can be improved.

Second Preferred Embodiment

A piezoelectric device according to a second preferred embodiment of the present invention will be described below with reference to the drawings. Since the piezoelectric device according to the second preferred embodiment of the present invention is different from piezoelectric device 100 according to the first preferred embodiment of the present invention only in including a reinforcement lower electrode layer, description of the configuration similar to that of piezoelectric device 100 according to the first preferred embodiment of the present invention will not be repeated.

FIG. 16 is a vertical cross-sectional view of the piezoelectric device according to the second preferred embodiment of the present invention. As shown in FIG. 16, a piezoelectric device 200 according to the second preferred embodiment of the present invention is provided with a reinforcement lower electrode layer 260 on a lower side of a portion in lower electrode layer 160 located below hole H.

Reinforcement lower electrode layer 260 is composed of a metal such as Al or Pt. Reinforcement lower electrode layer 260 may be composed of a conductive oxide such as $LaNiO_3$, $SrRuO_3$, or $RuO_2$. Reinforcement lower electrode layer 260 may be formed from an epitaxially grown film formed by epitaxial growth of a conductive substance.

Specifically, reinforcement lower electrode layer 260 is provided on the lower surface of lower electrode layer 160 by lift-off, plating, or etching. When reinforcement lower electrode layer 260 is composed of a conductive oxide, reinforcement lower electrode layer 260 is provided by formation of a film of a conductive oxide resulting from oxidation of a metal contained in a target on the lower surface of lower electrode layer 160 by reactive sputtering. When reinforcement lower electrode layer 260 is formed from an epitaxially grown film, reinforcement lower electrode layer 260 is provided by formation of a conductive film on the lower surface of lower electrode layer 160 by homoepitaxial growth and patterning of the conductive film.

In piezoelectric device 200 according to the second preferred embodiment of the present invention, reinforcement lower electrode layer 260 is provided on the lower side of the portion in lower electrode layer 160 located below hole H, so that a through hole in lower electrode layer 160 and reinforcement lower electrode layer 260 caused by overetching in providing hole H by etching can be prevented.

When the through hole is prevented from being caused by overetching by an increase in thickness of lower electrode layer 160 as a whole, stress generated in lower electrode layer 160 causes warpage of membrane portion Mb and excitation characteristics of the piezoelectric device are lowered. By providing reinforcement lower electrode layer 260 only on the lower side of the portion in lower electrode layer 160 located below hole H, however, lowering in excitation characteristics of piezoelectric device 200 due to warpage of membrane portion Mb can be reduced or prevented.

In the description of the preferred embodiments above, features that can be combined may be combined with one another.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base portion including a first main surface and a second main surface located opposite to the first main surface, the base portion including an opening in the first main surface; and
a layered portion on a side of the first main surface of the base portion to cover the opening from above; wherein
the layered portion includes, at least above the opening, a first single-crystal piezoelectric body layer, a second single-crystal piezoelectric body layer above the first single-crystal piezoelectric body layer, an intermediate electrode layer between the first single-crystal piezoelectric body layer and the second single-crystal piezoelectric body layer, a lower electrode layer on a lower side of the first single-crystal piezoelectric body layer and opposed to the intermediate electrode layer with the first single-crystal piezoelectric body layer being interposed, and an upper electrode layer on an upper side of the second single-crystal piezoelectric body layer and opposed to the intermediate electrode layer with the second single-crystal piezoelectric body layer being interposed, and the layered portion includes a membrane portion covering the opening;
the layered portion is provided with a hole that reaches the lower electrode layer through the first single-crystal piezoelectric body layer, the intermediate electrode layer, and the second single-crystal piezoelectric body layer at a position on an outer side of the opening when viewed in a direction orthogonal to the first main surface;
a drawn electrode connected to the lower electrode layer and insulated from the intermediate electrode layer inside of the hole and drawn to an upper surface of the second single-crystal piezoelectric body layer is provided;
the first single-crystal piezoelectric body layer includes a material that produces a difference in etching rate between a positive side and a negative side of a polarization charge; and
the polarization charge of the first single-crystal piezoelectric body layer is negative on a side of the intermediate electrode layer and positive on a side of the lower electrode layer.

2. The piezoelectric device according to claim 1, wherein the intermediate electrode layer is smaller in thickness than each of the lower electrode layer and the upper electrode layer.

3. The piezoelectric device according to claim 1, wherein the intermediate electrode layer includes Si.

4. The piezoelectric device according to claim 1, wherein
the second single-crystal piezoelectric body layer includes the material that produces a difference in etching rate between the positive side and the negative side of the polarization charge; and
the polarization charge of the second single-crystal piezoelectric body layer is negative on the side of the intermediate electrode layer and positive on a side of the upper electrode layer.

5. The piezoelectric device according to claim 1, wherein each of the first single-crystal piezoelectric body layer and the second single-crystal piezoelectric body layer includes lithium niobate ($LiNbO_3$) or lithium tantalate ($LiTaO_3$).

6. The piezoelectric device according to claim 1, wherein at least one of the lower electrode layer and the intermediate electrode layer includes a conductive oxide.

7. The piezoelectric device according to claim 1, wherein at least one of the lower electrode layer and the upper electrode layer includes an epitaxially grown film.

8. The piezoelectric device according to claim 1, wherein a reinforcement lower electrode layer is provided on a lower side of a portion in the lower electrode layer located below the hole.

9. The piezoelectric device according to claim 1, wherein the opening extends from a side of the first main surface and does not extend to the second main surface.

10. The piezoelectric device according to claim 1, wherein the opening extends from a side of the second main surface and does not extend to the first main surface.

11. The piezoelectric device according to claim 1, wherein the base layer includes Si.

12. The piezoelectric device according to claim 1, wherein the first single-crystal piezoelectric body layer is above the base portion.

13. The piezoelectric device according to claim 1, wherein the intermediate electrode layer includes Al or Pt.

14. The piezoelectric device according to claim 1, wherein the intermediate electrode layer includes Si with an electrical resistivity equal to or lower than about 20 mΩ cm.

15. The piezoelectric device according to claim 1, wherein a Ti layer is provided between the intermediate electrode layer and the first single-crystal piezoelectric body layer.

16. The piezoelectric device according to claim 1, wherein each of the lower electrode layer and the upper electrode layer includes Al or Pt.

17. The piezoelectric device according to claim 1, further comprising a first drawn interconnection and a second drawn interconnection.

18. The piezoelectric device according to claim 8, wherein the reinforcement lower electrode layer includes a conductive oxide.

19. The piezoelectric device according to claim 8, wherein the reinforcement lower electrode layer includes Al or Pt.

20. The piezoelectric device according to claim 8, wherein the reinforcement lower electrode layer includes an epitaxially grown film.

* * * * *